(12) United States Patent
Kawabuchi et al.

(10) Patent No.: US 10,692,739 B2
(45) Date of Patent: Jun. 23, 2020

(54) SUBSTRATE PROCESSING APPARATUS

(71) Applicant: Tokyo Electron Limited, Tokyo (JP)

(72) Inventors: Yosuke Kawabuchi, Kumamoto (JP); Gentaro Goshi, Kumamoto (JP); Keisuke Egashira, Kumamoto (JP); Hiroki Ohno, Kumamoto (JP); Hiroshi Marumoto, Kumamoto (JP); Takuro Masuzumi, Kumamoto (JP); Kento Tsukano, Kumamoto (JP); Shotaro Kitayama, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 113 days.

(21) Appl. No.: 15/907,522

(22) Filed: Feb. 28, 2018

(65) Prior Publication Data

US 2018/0254200 A1 Sep. 6, 2018

(30) Foreign Application Priority Data

Mar. 2, 2017 (JP) .................................. 2017-039027

(51) Int. Cl.
| | | |
|---|---|---|
| *F26B 5/08* | (2006.01) | |
| *H01L 21/67* | (2006.01) | |
| *F26B 5/00* | (2006.01) | |
| *H01L 21/02* | (2006.01) | |
| *F26B 21/14* | (2006.01) | |

(52) U.S. Cl.
CPC .......... *H01L 21/67034* (2013.01); *F26B 5/00* (2013.01); *F26B 5/005* (2013.01); *F26B 21/14* (2013.01); *H01L 21/02057* (2013.01); *H01L 21/02101* (2013.01); *H01L 21/67051* (2013.01); *H01L 21/67173* (2013.01)

(58) Field of Classification Search
CPC ......... H01L 21/67034; H01L 21/02057; H01L 21/02101; H01L 21/67051; H01L 21/67173; F26B 5/00; F26B 5/005; F26B 21/14; B05B 3/08
USPC .................................... 34/314, 312; 239/231
See application file for complete search history.

(56) References Cited

U.S. PATENT DOCUMENTS

2012/0266925 A1* 10/2012 Nakashima ....... H01L 21/67126
134/200
2015/0034121 A1* 2/2015 Ishibashi ........... H01L 21/67046
134/6

FOREIGN PATENT DOCUMENTS

JP 2013-012538 A 1/2013

* cited by examiner

*Primary Examiner* — John P McCormack
(74) *Attorney, Agent, or Firm* — Abelman, Frayne & Schwab

(57) ABSTRACT

A substrate processing apparatus according to an exemplary embodiment to the present disclosure includes: a main body which has therein a processing space capable of accommodating the substrate; a holding unit which holds the substrate in the main body; a supply unit which is provided at a side of the substrate held by the holding unit and supplies the processing fluid into the processing space; a discharge unit which discharges the processing fluid from an inside of the processing space; and a flow path limiting unit which limits a lower end of a flow path at an upstream side which is formed while the processing fluid flows from the supply unit to the discharge unit. Further, an upper end of the flow path limiting unit is disposed at a position higher than the upper surface of the substrate held by the holding unit.

8 Claims, 9 Drawing Sheets

SUBSTRATE PROCESSING APPARATUS

CROSS-REFERENCE TO RELATED APPLICATIONS

This application is based on and claims priority from Japanese Patent Application No. 2017-039027, filed on Mar. 2, 2017, with the Japan Patent Office, the disclosure of which is incorporated herein in its entirety by reference.

TECHNICAL FIELD

The present disclosure relates to a substrate processing apparatus.

BACKGROUND

In the related art, there has been known a method of drying a semiconductor wafer (hereinafter, referred to as a "wafer"), which is a substrate, by bringing the wafer having an upper surface wet with a liquid into contact with a processing fluid in a supercritical state during a drying processing after the upper surface of the water is processed by the liquid (see, for example, Japanese Patent Application Publication No. 2013-012538).

SUMMARY

A substrate processing apparatus according to an aspect of an exemplary embodiment is a substrate processing apparatus that performs a drying processing of drying a substrate having an upper surface wet with a liquid by bringing the substrate into contact with a processing fluid in a supercritical state. The substrate processing apparatus includes: a main body having therein a processing space capable of accommodating the substrate; a holding unit configured to hold the substrate within the main body; a supply unit provided at a side of the substrate held by the holding unit and configured to supply the processing fluid into the processing space; a discharge unit configured to discharge the processing fluid from an inside of the processing space; and a flow path limiting unit configured to limit an upstream side lower end of a flow path which is formed while the processing fluid flows from the supply unit to the discharge unit, wherein the flow path limiting unit has an upper end which is disposed at a position higher than the upper surface of the substrate held by the holding unit.

The foregoing summary is illustrative only and is not intended to be in any way limiting. In addition to the illustrative aspects, embodiments, and features described above, further aspects, embodiments, and features will become apparent by reference to the drawings and the following detailed description.

DESCRIPTION OF EMBODIMENT

Figure 1:
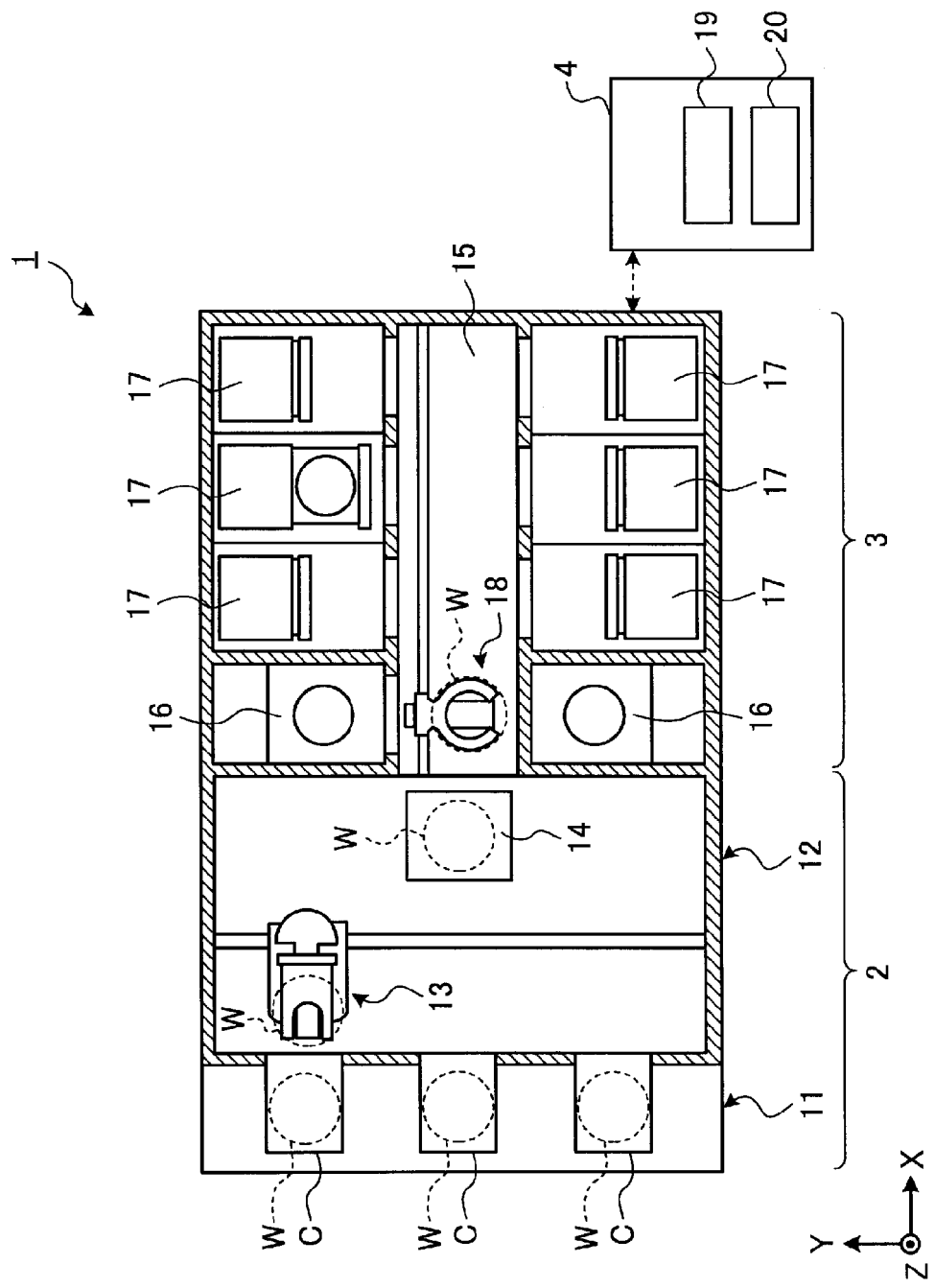
FIG. 1 is a schematic view illustrating a schematic configuration of a substrate processing system according to a first exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In a drying method in the related art which uses a processing fluid in a supercritical state, a flow path formed by the processing fluid in a processing container overlaps the wafer, and as a result, in some instances, the liquid applied onto the wafer is washed away from the wafer by the processing fluid. Therefore, the liquid on the wafer is dried on the wafer in a state in which the liquid is not dissolved in the processing fluid, and as a result, there is concern that so-called pattern collapse occurs in which patterns collapse due to surface tension applied from a gas-liquid interface while the liquid is dried.

An aspect of an exemplary embodiment has been made in consideration of the aforementioned situation, and provides a substrate processing apparatus which uses a processing fluid in a supercritical state and is capable of inhibiting patterns formed on the upper surface of a wafer from collapsing.

A substrate processing apparatus according to an aspect of an exemplary embodiment is a substrate processing apparatus that performs a drying processing of drying a substrate having an upper surface wet with a liquid by bringing the substrate into contact with a processing fluid in a supercritical state. The substrate processing apparatus includes: a main body having therein a processing space capable of accommodating the substrate; a holding unit configured to hold the substrate within the main body; a supply unit provided at a side of the substrate held by the holding unit and configured to supply the processing fluid into the processing space; a discharge unit configured to discharge the processing fluid from an interior of the processing space; and a flow path limiting unit configured to limit an upstream side lower end of a flow path which is formed while the processing fluid flows from the supply unit to the discharge unit, wherein the flow path limiting unit has an upper end which is disposed at a position higher than the upper surface of the substrate held by the holding unit.

In the above-described substrate processing apparatus, the upper end of the flow path limiting unit may be disposed at a position lower than an upper end of the liquid applied onto the substrate.

In the above-described substrate processing apparatus, the flow path limiting unit may be a rectifying plate disposed between the supply unit and the substrate held by the holding unit, and the rectifying plate may have an upper end disposed at a position higher than the upper surface of the substrate.

In the above-described substrate processing apparatus, the rectifying plate may be provided on the holding unit.

In the above-described substrate processing apparatus, a separate rectifying plate may be provided at a downstream side of the flow path.

In the above-described substrate processing apparatus, the flow path limiting unit may be a lower portion of a supply port of the supply unit.

A substrate processing apparatus according to another aspect of an exemplary embodiment is a substrate processing apparatus that performs a drying processing of drying a substrate having an upper surface wet with a liquid by bringing the substrate into contact with a processing fluid in a supercritical state. The substrate processing apparatus includes: a main body having therein a processing space capable of accommodating the substrate; a holding unit configured to hold the substrate within the main body; a supply unit provided at a side of the substrate held by the holding unit and configured to supply the processing fluid into the processing space; and a discharge unit configured to discharge the processing fluid from an inside of the processing space. The processing fluid ejected from the supply unit is directed toward a side above the substrate held by the holding unit while the processing fluid flows from the supply unit to the discharge unit.

In the above-described substrate processing apparatus, a direction of the processing fluid ejected from the supply unit may be inclined upward.

According to the aspects of the exemplary embodiment, it is possible to inhibit patterns formed on an upper surface of a wafer from collapsing in a substrate processing apparatus using a processing fluid in a supercritical state.

Hereinafter, respective exemplary embodiments of a substrate processing apparatus disclosed in the present application will be described in detail with reference to the accompanying drawings. Further, the present disclosure is not limited by the respective exemplary embodiments disclosed below.

<Overview of Substrate Processing System>

First, a schematic configuration of a substrate processing system 1 according to a first exemplary embodiment will be described with reference to FIG. 1. FIG. 1 is a view illustrating the schematic configuration of the substrate processing system 1 according to the first exemplary embodiment. Hereinafter, in order to make positional relationships clear, an X axis, a Y axis, and a Z axis, which are orthogonal to one another, are defined, and a Z-axis forward direction is defined as a vertically upward direction.

As illustrated in FIG. 1, the substrate processing system 1 includes a carry-in/out station 2 and a processing station 3. The carry-in/out station 2 and the processing station 3 are provided adjacent to each other.

The carry-in/out station 2 includes a carrier placement section 11 and a transport section 12. Multiple carriers C, each of which accommodates therein multiple sheets of semiconductor wafers W (hereinafter, referred to as a "wafer W") in a horizontal state, are disposed on the carrier placement section 11.

The transport section 12 is provided adjacent to the carrier placement section 11, and has therein a substrate transport device 13 and a delivery unit 14. The substrate transport device 13 is provided with a wafer holding mechanism for holding the wafer W. In addition, the substrate transport device 13 may move in horizontal and vertical directions and may turn about a vertical axis in order to transport the wafer W between the carrier C and the delivery unit 14 using the wafer holding mechanism.

The processing station 3 is provided adjacent to the transport section 12. The processing station 3 is provided with a transport section 15, multiple cleaning processing units 16, and multiple drying processing units 17. The multiple cleaning processing units 16 and the multiple drying processing units 17 are disposed at both sides of the transport section 15. Further, the arrangement or the number of the cleaning processing units 16 and the drying processing units 17 illustrated in FIG. 1 are examples, and the present disclosure is not limited to the illustrated configuration.

The transport section 15 has therein a substrate transport device 18. The substrate transport device 18 is provided with a wafer holding mechanism configured to hold the wafer W. In addition, the substrate transport device 18 may move in horizontal and vertical directions and may turn about the vertical axis in order to transport the wafer W between the delivery unit 14 and the cleaning processing units 16 and the drying processing units 17 using the wafer holding mechanism.

Each cleaning processing unit 16 performs a predetermined cleaning processing on the wafer W transported thereto by the substrate transport device 18. A configuration example of the cleaning processing unit 16 will be described below.

Each drying processing unit 17 performs a predetermined drying processing on the wafer W cleaned by the cleaning processing unit 16. A configuration example of the drying processing unit 17 will be described below.

In addition, the substrate processing system 1 is provided with a control device 4. The control device 4 is, for example, a computer, and has a controller 19 and a storage unit 20.

The controller 19 includes a microcomputer having a central processing unit (CPU), a read only memory (ROM), a random access memory (RAM), input and output ports, and the like, or various types of circuits. The CPU of the microcomputer reads and executes a program stored in the ROM, thereby implementing the control to be described below.

The program may be recorded in a computer-readable recording medium, and installed in the storage unit 20 of the control device 4 from the recording medium. For example, a hard disk (HD), a flexible disk (FD), a compact disk (CD), a magneto-optical disk (MO), a memory card, and the like may be used as the computer-readable recording medium.

For example, the storage unit 20 may be implemented with a semiconductor memory element such as, for example, a RAM or a flash memory, or a storage device such as, for example, a hard disk or an optical disk.

In the substrate processing system 1 configured as described above, first, the substrate transport device 13 of the carry-in/out station 2 extracts a wafer W from a carrier C mounted on the carrier placement section 11, and mounts the extracted wafer W on the delivery unit 14. The wafer W mounted on the delivery unit 14 is extracted from the delivery unit 14 by the substrate transport device 18 of the processing station 3, and carried into a cleaning processing unit 16.

The wafer W carried into the cleaning processing unit 16 is cleaned by the cleaning processing unit 16, and then carried out from the cleaning processing unit 16 by the substrate transport device 18. The wafer W carried out from the cleaning processing unit 16 is carried into a drying processing unit 17 by the substrate transport device 18, and dried by the drying processing unit 17.

The wafer W dried by the drying processing unit 17 is carried out from the drying processing unit 17 by the substrate transport device 18, and mounted on the delivery unit 14. Further, the wafer W, which is completely processed and mounted on the delivery unit 14, is returned back to a carrier C of the carrier placement section 11 by the substrate transport device 13.

<Overview of Cleaning Processing Unit>

Figure 2:
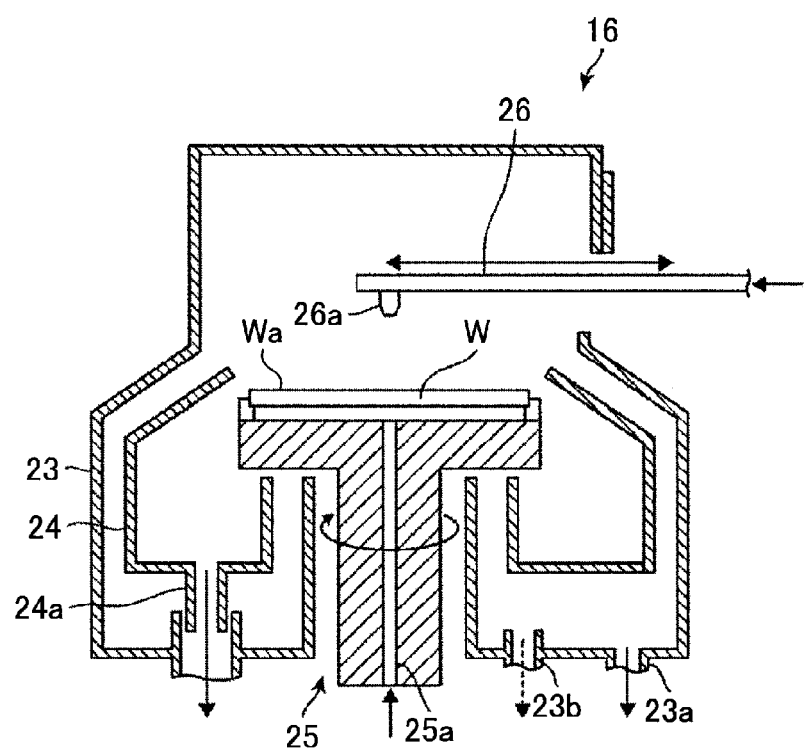
FIG. 2 is a cross-sectional view illustrating a configuration of a cleaning processing unit according to the first exemplary embodiment.

Next, a schematic configuration of the cleaning processing unit 16 will be described with reference to FIG. 2. FIG. 2 is a cross-sectional view illustrating a configuration of the cleaning processing unit 16 according to the first exemplary embodiment. The cleaning processing unit 16 is configured as, for example, a single wafer type cleaning processing unit which cleans one wafer W at a time by spin cleaning.

As illustrated in FIG. 2, the cleaning processing unit 16 approximately horizontally holds the wafer W using a wafer holding mechanism 25 disposed in an outer chamber 23 that defines a processing space, and the wafer W is rotated as the wafer holding mechanism 25 rotates about the vertical axis. Further, the cleaning processing unit 16 allows a nozzle arm 26 to extend to a side above the rotating wafer W, and supplies a chemical liquid and a rinse liquid in a predetermined order from a chemical liquid nozzle 26a provided at a tip portion of the nozzle arm 26, thereby cleaning the upper surface Wa of the wafer W.

A chemical liquid supply path 25a is also formed in the wafer holding mechanism 25 of the cleaning processing unit 16. Further, the rear surface of the wafer W is cleaned by a chemical liquid and a rinse liquid supplied from the chemical liquid supply path 25a.

For example, during the aforementioned processing of cleaning the wafer W, particles and organic contaminants are initially removed by an SC1 liquid (a liquid mixture of ammonia and a hydrogen peroxide solution) which is an alkaline chemical liquid, and then rinse cleaning is performed by deionized water (hereinafter, referred to as "DIW") which is a rinse liquid. Next, a natural oxide film is removed by diluted hydrofluoric acid (hereinafter, referred to as "DHF") which is an acidic chemical liquid, and then the rinse cleaning is performed by the DIW.

The aforementioned various types of chemical liquids are received in the outer chamber 23 or an inner cup 24 disposed in the outer chamber 23, and the chemical liquids are discharged from a liquid discharge port 23a provided at a bottom portion of the outer chamber 23 or a liquid discharge port 24a provided at a bottom portion of the inner cup 24. Further, the atmosphere within the outer chamber 23 is evacuated from a gas discharge port 23b provided in the bottom portion of the outer chamber 23.

After rinsing the wafer W as described above, a liquid-phase IPA (hereinafter, referred to as an "IPA liquid") is supplied onto the upper surface Wa and the rear surface of the wafer W while the wafer holding mechanism 25 rotates such that the IPA liquid is substituted for the DIW remaining on both surfaces of the wafer W. Thereafter, the rotation of the wafer holding mechanism 25 is gently stopped.

The wafer W, which is completely cleaned as described above, is delivered to the substrate transport device 18 by a delivery mechanism (not illustrated) provided on the wafer holding mechanism 25 in a state in which an IPA liquid 71 (see FIG. 4) is applied onto the upper surface Wa (state in which a liquid film of the IPA liquid 71 is formed on the upper surface Wa of the wafer W), and the wafer W is then carried out from the cleaning processing unit 16.

Here, the IPA liquid 71 applied onto the upper surface Wa of the wafer W functions as a drying prevention liquid which prevents the pattern collapse caused by evaporation (vaporization) of the liquid on the upper surface Wa while the wafer W is transported from the cleaning processing unit 16 to the drying processing unit 17 or while the wafer W is carried into the drying processing unit 17. The thickness of the IPA liquid 71 applied onto the wafer W is, for example, about 1 mm to 5 mm.

After the cleaning processing is completed by the cleaning processing unit 16, the wafer W having the upper surface Wa onto which the IPA liquid 71 is applied is transported to a drying processing unit 17. Further, a processing of drying the wafer W is performed in the drying processing unit 17 by bringing a processing fluid 70 (see FIG. 4) in a super-critical state into contact with the IPA liquid 71 on the upper surface Wa, thereby removing the IPA liquid 71 while dissolving the IPA liquid 71 in the processing fluid 70 in the supercritical state.

<Overview of Drying Processing Unit>

Figure 3:
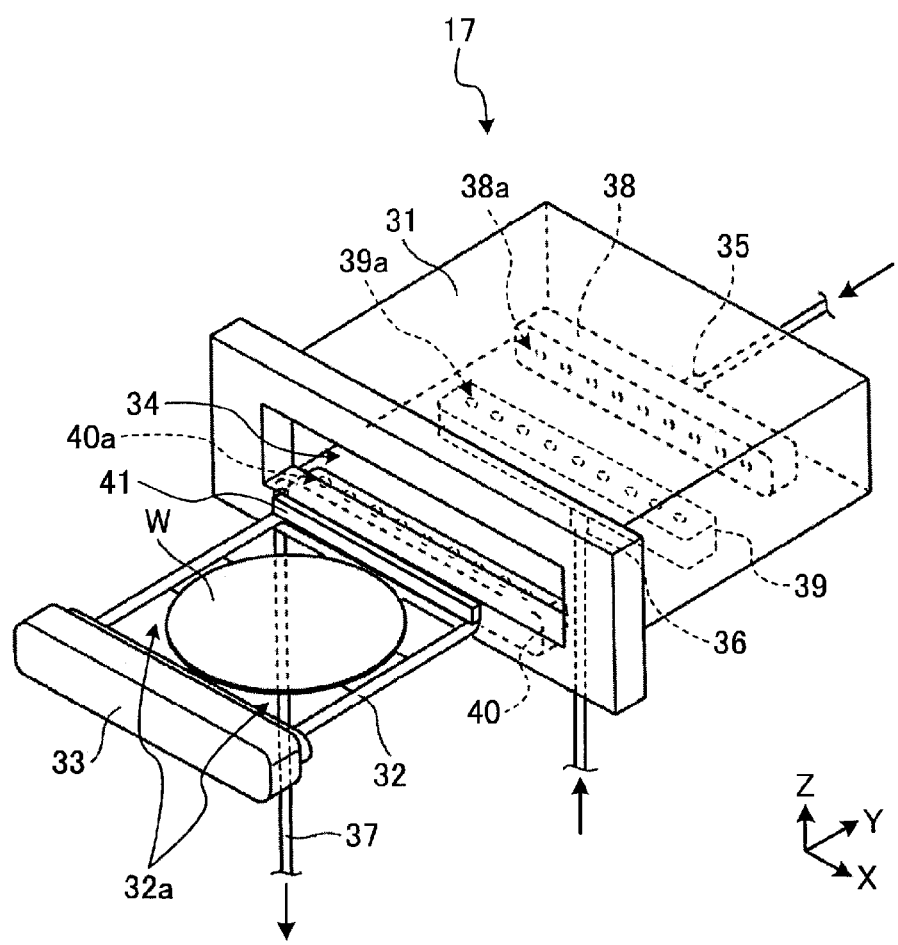
FIG. 3 is a perspective view illustrating an external appearance of a configuration of a drying processing unit according to the first exemplary embodiment.

Hereinafter, a configuration of the drying processing unit 17 will be described. FIG. 3 is a perspective view illustrating an external appearance of a configuration of the drying processing unit 17 according to the first exemplary embodiment.

The drying processing unit 17 has a main body 31, a holding unit 32, and a lid member 33. An opening 34 is formed in the main body 31 having a casing shape so as to carry a wafer W into or out of the drying processing unit 17 therethrough. The holding unit 32 holds the wafer W to be processed in the horizontal direction. An aperture 32a is formed, between the held wafer W and the lid member 33, in the holding unit 32 having a substantially flat plate shape.

The lid member 33 supports the holding unit 32 and seals the opening 34 when the wafer W is carried into the main body 31.

For example, the main body 31 is a container having therein a processing space 31a (see FIG. 4) capable of accommodating the wafer W having a diameter of 300 mm, and supply ports 35 and 36 and a discharge port 37 are provided in a wall portion of the main body 31. The supply ports 35 and 36 and the discharge port 37 are connected to supply lines, respectively, which are provided at an upstream side and a downstream side of the drying processing unit 17, and allow the processing fluid 70 (see FIG. 4) to flow therethrough. A configuration example of the supply lines will be described below.

The supply port 35 is connected to a side surface of the casing-shaped main body 31 opposite to the opening 34. In addition, the supply port 36 is connected to a bottom surface of the main body 31. Further, the discharge port 37 is connected to a lower side of the opening 34. While FIG. 3 illustrates the two supply ports 35 and 36 and the single discharge port 37, the number of supply ports 35 and 36 and the number of discharge ports 37 are not particularly limited.

Fluid supply headers 38 and 39, which are examples of supply units, and a fluid discharge header 40, which is an example of a discharge unit, are provided in the main body 31. Further, each o fluid supply header 38 or 39 has multiple supply ports 38a or 39a formed therein and arranged in the longitudinal direction of the fluid supply header 38 or 39, and the fluid discharge header 40 has multiple discharge ports 40a formed therein and arranged in the longitudinal direction of the fluid discharge header 40.

The fluid supply header 38 is connected to the supply port 35 and provided in the casing-shaped main body 31 adjacent to the side opposite to the opening 34. In addition, the multiple supply ports 38a formed and arranged in the fluid supply header 38 are directed toward the opening 34 side.

The fluid supply header 39 is connected to the supply port 36 and provided in the central portion of the bottom surface in the casing-shaped main body 31. In addition, the multiple supply ports 39a formed and arranged in the fluid supply header 39 are directed upward.

The fluid discharge header 40 is connected to the discharge port 37 and provided in the casing-shaped main body 31 adjacent to the side surface of the opening 34 side and below the opening 34. In addition, the multiple discharge ports 40a formed to be arranged in the fluid discharge header 40 are directed upward.

The fluid supply headers 38 and 39 supply the processing fluid 70 into the main body 31. In addition, the fluid discharge header 40 guides and discharges the processing fluid 70 in the main body 31 to the outside of the main body 31.

Here, a rectifying plate 41, which regulates the flow of the processing fluid 70, is provided in the main body 31 between the fluid supply header 38 and the wafer W held by the holding unit 32. For example, the rectifying plate 41 is erected on the holding unit 32 at the fluid supply header 38 side so as to block a portion between the wafer W and the fluid supply header 38. Further, a detail of the flow of the processing fluid 70 within the main body 31 will be described below.

The drying processing unit 17 further includes a pressing mechanism (not illustrated). The pressing mechanism serves to seal the processing space 31a by pressing the lid member 33 to the main body 31 against internal pressure caused by the processing fluid 70 which is in the supercritical state and is supplied into the processing space 31a within the main body 31. In addition, a heat insulating material, a tape heater, or the like may be provided on a surface of the main body 31 in order to maintain the processing fluid 70 supplied into the processing space 31a at a predetermined temperature.

Figure 4:
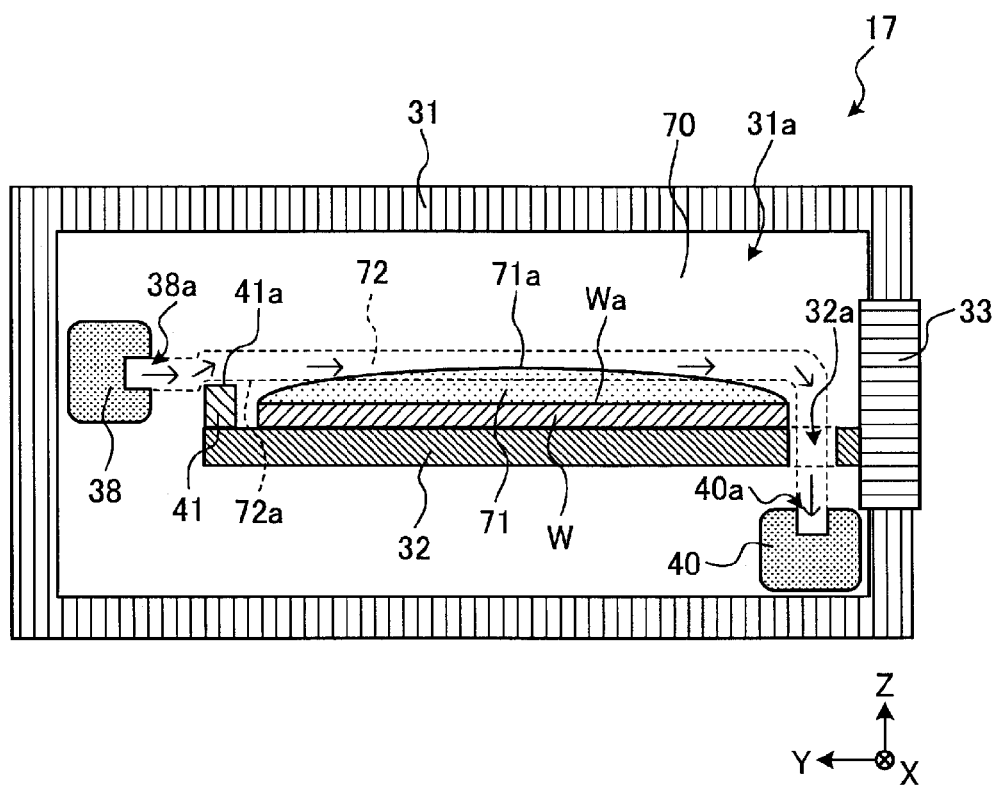
FIG. 4 is a cross-sectional view illustrating an example of an internal configuration of the drying processing unit according to the first exemplary embodiment.

In the first exemplary embodiment, the IPA liquid 71 (see FIG. 4) is used as the drying prevention liquid, and $CO_2$ is used as the processing fluid 70 (see FIG. 4). However, a liquid (e.g., an organic solvent such as methanol) other than the IPA may be used as the drying prevention liquid, and a fluid other than $CO_2$ may be used as the processing fluid 70.

Here, in comparison with a liquid (e.g., the IPA liquid 71), the processing fluid 70 in the supercritical state has lower viscosity and a high ability to dissolve a liquid, and does not have an interface between the processing fluid 70 in the supercritical state and a liquid or gas in an equilibrium state. Therefore, the drying processing using the processing fluid 70 in the supercritical state may inhibit pattern collapse of a pattern P because it is possible to dry the liquid without being affected by surface tension.

Meanwhile, when a flow path of the processing fluid 70 in the main body 31 is formed to overlap the wafer W during the drying processing using the processing fluid 70 in the supercritical state, the applied IPA liquid 71 is washed away from the wafer W by the processing fluid 70 in some cases.

Therefore, the applied IPA liquid 71 is dried on the wafer W in a state in which the IPA liquid 71 is not dissolved in the processing fluid 70, and as a result, there is concern that a pattern P collapses by surface tension applied to the pattern P from a gas-liquid interface while the IPA liquid 71 is dried.

Therefore, according to the drying processing unit 17 according to the first exemplary embodiment, the flow of the processing fluid 70 is controlled by the internal configuration, thereby inhibiting the pattern P formed on the wafer W from collapsing.

First Exemplary Embodiment

Subsequently, the drying processing unit 17 according to the first exemplary embodiment will be described in detail with reference to FIG. 4. FIG. 4 is a cross-sectional view illustrating an example of an internal configuration of the drying processing unit 17 according to the first exemplary embodiment.

Until the point in time illustrated in FIG. 4, the wafer W onto which the IPA liquid 71 is applied first is held by the holding unit 32 and carried into the drying processing unit 17. Next, the processing fluid 70 is supplied into the drying processing unit 17 through the fluid supply header 39 (see FIG. 3), the processing space 31a of the main body 31 is filled with the processing fluid 70, the pressure of which is increased to a desired pressure.

As illustrated in FIG. 4, the processing fluid 70 is supplied from the fluid supply header 38, the processing fluid 70 is discharged from the fluid discharge header 40, and a flow path 72 of the processing fluid 70 is formed between the fluid supply header 38 and the fluid discharge header 40. Further, because the fluid supply header 39 does not supply the processing fluid 70 while the flow path 72 is formed, the illustration of the fluid supply header 39 is omitted from FIG. 4.

For example, the flow path 72 is provided at a lateral side of the wafer W, and the flow path 72 is formed in the approximately horizontal direction above the wafer W to be directed toward the lid member 33 along the upper surface Wa of the wafer W from the fluid supply header 38 of which the supply ports 38a are directed in the approximately horizontal direction. Further, the direction of the flow path 72 is changed to a downward direction in the vicinity of the lid member 33, the flow path 72 passes through the aperture 32a formed in the holding unit 32, and the flow path 72 is directed toward the discharge ports 40a of the fluid discharge header 40. For example, the processing fluid 70 flows in a laminar flow in the flow path 72.

Here, in the first exemplary embodiment, the rectifying plate 41 is provided between the fluid supply header 38 and the wafer W, that is, at an upstream side of the wafer W in the flow path 72. Further, the upper end 41a of the rectifying plate 41 is disposed at a position higher than the upper surface Wa of the wafer W. Therefore, the position of the lower end 72a of the flow path 72 at the upstream side is limited to a position higher than the upper surface Wa of the wafer W. That is, the rectifying plate 41 functions as a flow path limiting unit which limits the lower end 72a of the flow path 72 at the upstream side.

In the first exemplary embodiment, the flow path 72 may be formed not to overlap the wafer W since the flow path limiting unit (the rectifying plate 41) is provided, and as a result, it is possible to inhibit the applied IPA liquid 71 from being washed away from the upper surface Wa of the wafer W by the processing fluid 70.

Therefore, according to the first exemplary embodiment, the IPA liquid 71 may be sufficiently removed from between the patterns P by the processing fluid 70, and as a result, it is possible to inhibit the patterns P formed on the upper surface Wa of the wafer W from collapsing during the drying processing using the processing fluid 70.

In the first exemplary embodiment, as illustrated in FIG. 4, the upper end 41a of the flow path limiting unit (rectifying plate 41) may be provided at a position lower than the upper end 71a of the IPA liquid 71 applied onto the wafer W. In other words, the IPA liquid 71 may be applied onto the wafer W such that the upper end 71a of the IPA liquid 71 is provided at a position higher than the upper end 41a of the flow path limiting unit (the rectifying plate 41).

Since the upper end 41a of the flow path limiting unit (rectifying plate 41) is disposed as described above, pressure may be applied to the IPA liquid 71 by the flow path 72 of the processing fluid 70. Further, with this pressure, it is possible to facilitate the dissolution of the IPA liquid 71 in the processing fluid 70.

Therefore, according to the first exemplary embodiment, the upper end 41a of the flow path limiting unit (rectifying plate 41) is provided at a position lower than the upper end 71a of the IPA liquid 71, and as a result, it is possible to complete the drying processing in a shorter time.

In the first exemplary embodiment, the rectifying plate 41 is provided at the upstream side of the wafer W in the flow path 72, thereby limiting the position of the lower end 72a in the flow path 72. It is possible to effectively inhibit the applied IPA liquid 71 from being washed away from the wafer W since it is possible to effectively limit the position of the lower end 72a of the flow path 72 at the upstream side by using the rectifying plate 41 as described above.

In the first exemplary embodiment, the rectifying plate 41 is erected on the holding unit 32 at the fluid supply header 38 side so as to block a portion between the wafer W and the fluid supply header 38. It is possible to more effectively inhibit the applied IPA liquid 71 from being washed away from the wafer W by disposing the rectifying plate 41 adjacent to the wafer W so as to block the flow from the fluid supply header 38 as described above.

Modified Example

Figure 5:
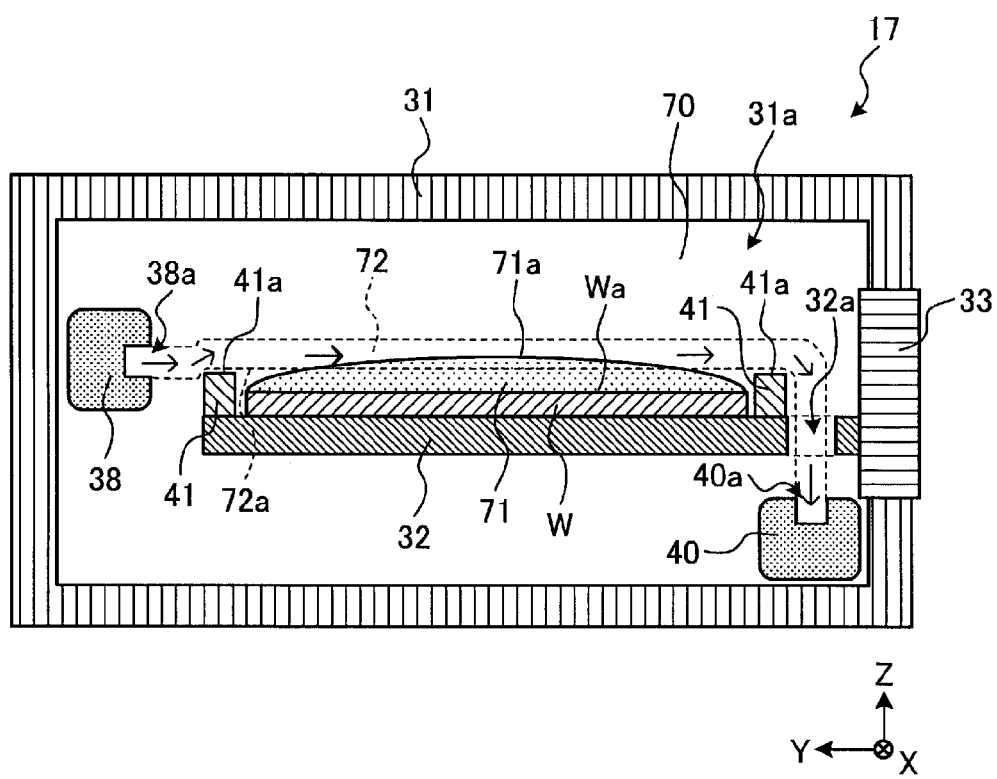
FIG. 5 is a cross-sectional view illustrating an example of an internal configuration of a drying processing unit according to Modified Example 1 of the first exemplary embodiment.

Subsequently, various types of modified examples of the drying processing unit 17 according to the first exemplary embodiment will be described in detail with reference to FIGS. 5 to 7. FIG. 5 is a cross-sectional view illustrating an example of an internal configuration of the drying processing unit 17 according to Modified Example 1 of the first exemplary embodiment. Further, in the following description, the constituent elements similar to the respective constituent elements in the aforementioned first exemplary embodiment are denoted by the same reference numerals, and descriptions of the configurations similar to the configurations in the first exemplary embodiment may be omitted.

As illustrated in FIG. 5, in Modified Example 1, the rectifying plate 41 is provided not only at the upstream side of the wafer W in the flow path 72, but also at a downstream side of the wafer W. Further, similar to the rectifying plate 41 at the upstream side, the upper end 41a of the rectifying plate 41 at the downstream side is disposed at a position higher than the upper surface Wa of the wafer W.

Since the rectifying plate 41 is also provided at the downstream side of the flow path 72 as described above, it is possible to limit, with high precision, the position of the lower end 72a of the flow path 72 from the upstream side to the downstream side. Further, since the upper ends 41a of the two rectifying plates 41 are disposed at the positions higher than the upper surface Wa of the wafer W, it is further possible to form the flow path 72 so that the flow path 72 does not overlap the wafer W.

Therefore, according to Modified Example 1, it is possible to further inhibit the applied IPA liquid 71 from being washed away from the wafer W, and as a result, it is possible to further inhibit the patterns P formed on the upper surface Wa of the wafer W from collapsing during the drying processing using the processing fluid 70.

In Modified Example 1, for example, the rectifying plate 41 is erected to surround a placement portion of the holding unit 32 on which the wafer W is placed such that the placement portion of the holding unit 32 on which the wafer W is placed is formed in a bowl shape, and as a result, the rectifying plate 41 may also be provided at the downstream side of the flow path 72.

Figure 6:
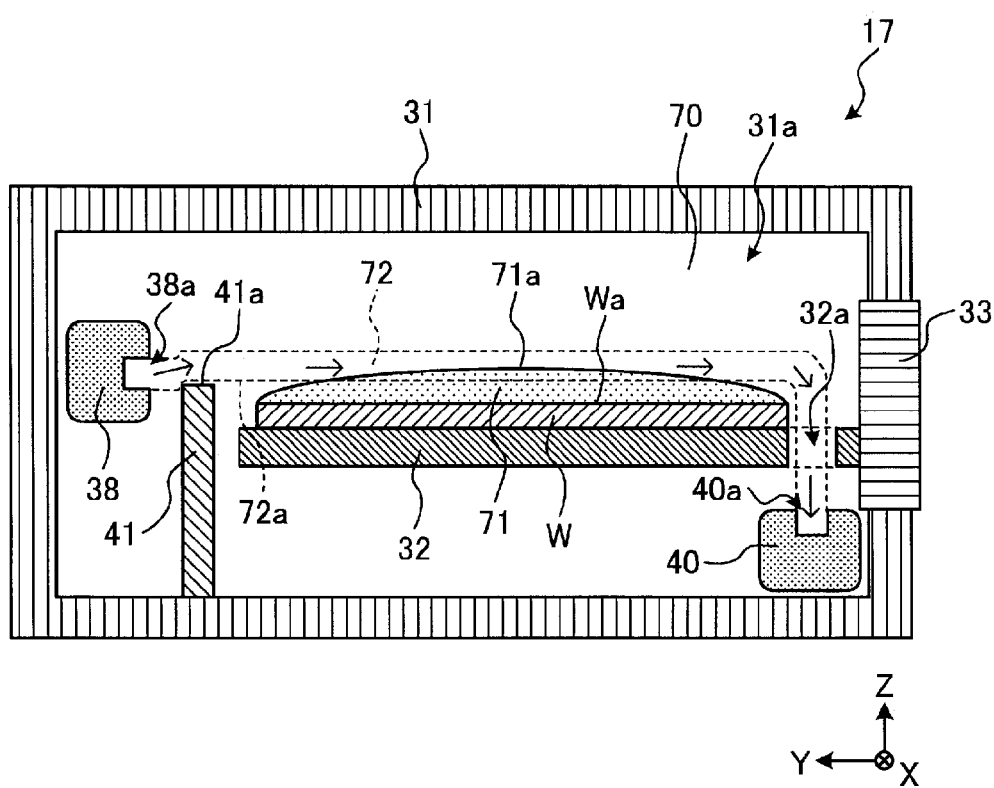
FIG. 6 is a cross-sectional view illustrating an example of an internal configuration of a drying processing unit according to Modified Example 2 of the first exemplary embodiment.

FIG. 6 is a cross-sectional view illustrating an example of an internal configuration of the drying processing unit 17 according to Modified Example 2 of the first exemplary embodiment. As illustrated in FIG. 6, in Modified Example 2, the rectifying plate 41 is provided on the main body 31 of the drying processing unit 17, not on the holding unit 32.

Similar to the first exemplary embodiment, the upper end 41a of the rectifying plate 41 is disposed at a position higher than the upper surface Wa of a wafer W. Therefore, similar to the first exemplary embodiment, it is possible to inhibit the applied IPA liquid 71 from being washed away from the wafer W, and as a result, it is possible to inhibit a pattern P formed on the upper surface Wa of the wafer W from collapsing.

In Modified Example 2, for example, the rectifying plate 41 is erected on the bottom surface of the main body 31 so as to block a portion between the fluid supply header 38 and the holding unit 32. However, the installation form of the rectifying plate 41 in Modified Example 2 is not limited to this example, and the method of installing the rectifying plate 41 is not limited as long as the rectifying plate 41 is disposed in the main body 31 so as to function as the flow path limiting unit which limits the lower end 72a of the flow path 72 at the upstream side.

Figure 7:
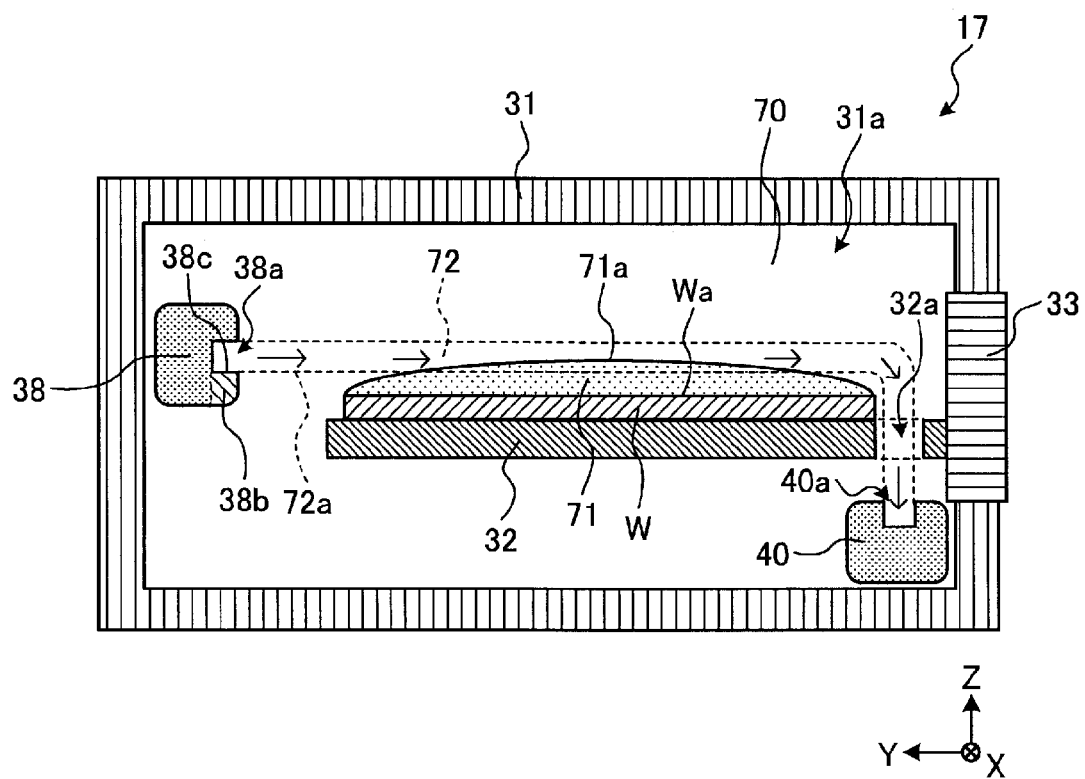
FIG. 7 is a cross-sectional view illustrating an example of an internal configuration of a drying processing unit according to Modified Example 3 of the first exemplary embodiment.

FIG. 7 is a cross-sectional view illustrating an example of an internal configuration of the drying processing unit 17 according to Modified Example 3 of the first exemplary embodiment. As illustrated in FIG. 7, in Modified Example 3, the lower end 72a of the flow path 72 is not limited by using the rectifying plate 41, but the lower end 72a of the flow path 72 is limited by disposing the fluid supply header 38 at a predetermined position.

Specifically, in the fluid supply header 38, a header bottom portion 38b, which is a lower portion of the supply port 38a, functions as the flow path limiting unit. Further, an upper end 38c of the flow path limiting unit (header bottom portion 38b) is disposed at a position higher than the upper surface Wa of the wafer W. In other words, a bottom portion of the supply port 38a is disposed at a position higher than the upper surface Wa of the wafer W.

Therefore, similar to the first exemplary embodiment, it is possible to inhibit the applied IPA liquid 71 from being washed away from the wafer W, and as a result, it is possible to inhibit the patterns P formed on the upper surface Wa of the wafer W from collapsing.

In Modified Example 3, it is possible to inhibit the collapse of the patterns P formed on the upper surface Wa of the wafer W without separately providing the rectifying plate 41. Therefore, according to Modified Example 3, costs required to manufacture or mount the rectifying plate 41 are not needed, and as a result, it is possible to perform the drying processing in the substrate processing system 1 at a low cost.

In Modified Examples 1 to 3, similar to the first exemplary embodiment, the upper end 41a of the rectifying plate 41 or the upper end 38c of the header bottom portion 38b may be provided at a position lower than the upper end 71a of the IPA liquid 71 applied onto the wafer W. Therefore, similar to the first exemplary embodiment, it is possible to facilitate the dissolution of the IPA liquid 71 in the processing fluid 70, and as a result, it is possible to complete the drying processing in a shorter time.

Second Exemplary Embodiment

Figure 8:
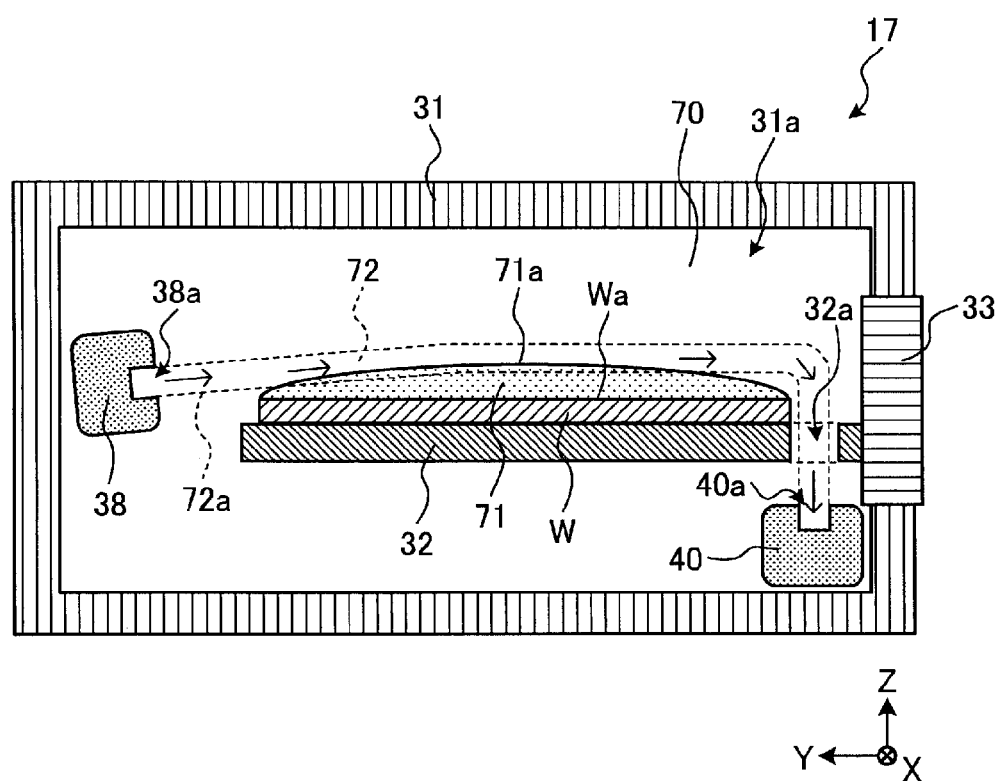
FIG. 8 is a cross-sectional view illustrating an example of an internal configuration of a drying processing unit according to a second exemplary embodiment.

Next, a drying processing unit 17 according to a second exemplary embodiment will be described in detail with reference to FIG. 8. FIG. 8 is a cross-sectional view illustrating an example of an internal configuration of the drying processing unit 17 according to the second exemplary embodiment.

In the second exemplary embodiment, the supply port 38a of the fluid supply header 38 is inclined upward such that the processing fluid 70 ejected from the fluid supply header 38 is directed toward the side above the wafer W.

As described above, since the fluid supply header 38 is disposed such that the processing fluid 70 is directed toward the side above the wafer W, it is possible to form the flow path 72 of the processing fluid 70 in such a manner that the flow path 72 does not overlap the wafer W as illustrated in FIG. 8. Therefore, it is possible to inhibit the applied IPA liquid 71 from being washed away from the upper surface Wa of the wafer W by the processing fluid 70.

Therefore, according to the second exemplary embodiment, the IPA liquid 71 may be sufficiently removed from between the patterns P by the processing fluid 70, and as a result, it is possible to inhibit the patterns P formed on the upper surface Wa of the wafer W from collapsing during the drying processing using the processing fluid 70.

In the second exemplary embodiment, the supply port 38a of the fluid supply header 38 is inclined upward, and as a result, the flow path 72 of the processing fluid 70 is formed not to overlap the wafer W. Since the supply port 38a of the fluid supply header 38 is inclined upward as described above, it is possible to dispose the fluid supply header 38 at a lower position in comparison with the case in which the fluid supply header 38 is directed in the approximately horizontal direction (see, for example, FIG. 7).

Therefore, it is possible to limit a height of the processing space 31a in the main body 31, thereby decreasing a height of the main body 31. Therefore, according to the second exemplary embodiment, the supply port 38a of the fluid supply header 38 is inclined upward, and as a result, it is possible to realize the compact drying processing unit 17.

In the second exemplary embodiment, the flow path 72 may be formed to overlap the upper surface of the IPA liquid 71 applied onto the wafer W, as illustrated in FIG. 8. Therefore, pressure may be applied to the IPA liquid 71 using the flow path 72 of the processing fluid 70. Further, with this pressure, it is possible to facilitate the dissolution of the IPA liquid 71 in the processing fluid 70.

Therefore, according to the second exemplary embodiment, the flow path 72 is formed to overlap the upper surface of the applied IPA liquid 71, and as a result, it is possible to complete the drying processing in a shorter time.

Figure 9:
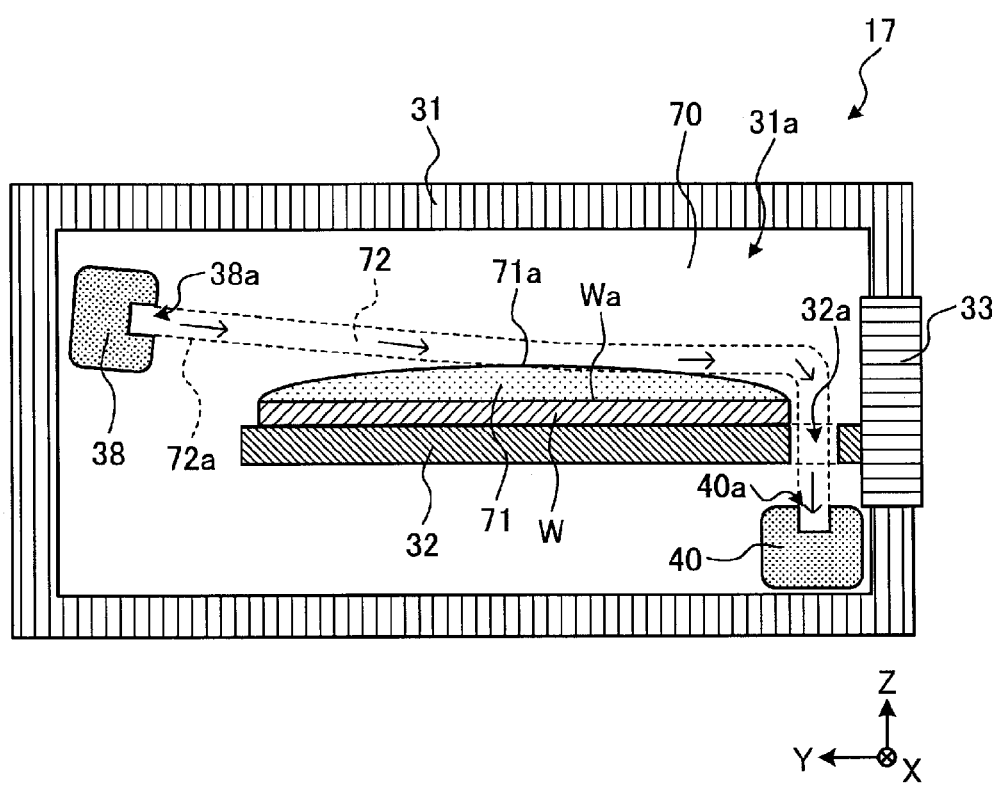
FIG. 9 is a cross-sectional view illustrating an example of an internal configuration of a drying processing unit according to a modified example of the second exemplary embodiment.

In the second exemplary embodiment, the supply port 38a of the fluid supply header 38 is inclined upward, but the direction of the supply port 38a is not limited to the inclined upward direction, and as illustrated in FIG. 9, the supply port 38a may be inclined downward. FIG. 9 is a cross-sectional view illustrating an example of an internal configuration of the drying processing unit 17 according to a modified example of the second exemplary embodiment.

Even in the case in which the supply port 38a is inclined downward as described above, it is possible to form the flow path 72 of the processing fluid 70 not to overlap the wafer W by disposing the fluid supply header 38 above the wafer W such that the processing fluid 70 ejected from the fluid supply header 38 is directed toward the side above the wafer W. Therefore, it is possible to inhibit the applied IPA liquid 71 from being washed away from the wafer W.

While respective exemplary embodiments of the present disclosure have been described above, the present disclosure is not limited to the exemplary embodiments, and may be variously changed without departing from the purpose of the present disclosure. For example, in the aforementioned second exemplary embodiment, the configuration in which the rectifying plate 41 is not provided has been described, but the rectifying plate 41 may be added as described in the first exemplary embodiment.

The substrate processing apparatus according to the exemplary embodiment is a substrate processing apparatus which performs a drying processing of drying the substrate (wafer W) having the upper surface Wa wet with the liquid (IPA liquid 71) by bringing the substrate (wafer W) into contact with the processing fluid 70 in the supercritical state. The substrate processing apparatus includes: a main body 31 having therein a processing space 31a capable of accommodating a substrate (wafer W); a holding unit 32 configured to hold the substrate (wafer W) in the main body 31; a supply unit (a fluid supply header 38) provided at a side of the substrate (wafer W) held by the holding unit 32 and configured to supply the processing fluid 70 into the processing space 31a; a discharge unit (a fluid discharge header 40) configured to discharge the processing fluid 70 from the inside of the processing space 31a; and a flow path limiting unit (a rectifying plate 41 a header bottom portion 38b) which limits the upstream side lower end 72a of the flow path 72 which is formed while the processing fluid 70 flows from the supply unit (the fluid supply header 38) to the discharge unit (fluid discharge header 40). Further, the upper end 41a (38c) of the flow path limiting unit (the rectifying plate 41, a header bottom portion 38b) is disposed at a position higher than the upper surface Wa of the substrate (wafer W) held by the holding unit 32. Therefore, it is possible to inhibit a pattern P formed on the upper surface Wa of the wafer W from collapsing during the drying processing using the processing fluid 70.

In the substrate processing apparatus according to the exemplary embodiment, the upper end 41a (38c) of the flow path limiting unit (the rectifying plate 41, the header bottom portion 38b) is disposed at a position lower than the upper end 71a of the liquid (IPA liquid 71) applied onto the substrate (wafer W). Therefore, it is possible to complete the drying processing in a shorter time.

In the substrate processing apparatus according to the exemplary embodiment, the flow path limiting unit is the rectifying plate 41 disposed between the supply unit (the fluid supply header 38) and the substrate (the wafer W) held by the holding unit 32, and the rectifying plate 41 has the upper end 41a disposed at the position higher than the upper surface Wa of the substrate (wafer W). Therefore, it is possible to effectively inhibit the applied IPA liquid 71 from being washed away from the wafer W.

In the substrate processing apparatus according to the exemplary embodiment, the rectifying plate 41 is provided on the holding unit 32. Therefore, it is possible to more effectively inhibit the applied IPA liquid 71 from being washed away from the wafer W.

In the substrate processing apparatus according to the exemplary embodiment, the separate rectifying plate 41 is provided at the downstream side of the flow path 72. Therefore, it is possible to further inhibit the patterns P formed on the upper surface Wa of the wafer W from collapsing during the drying processing using the processing fluid 70.

In the substrate processing apparatus according to the exemplary embodiment, the flow path limiting unit is the lower portion (header bottom portion 38b) of the supply port 38a of the supply unit (fluid supply header 38). Therefore, it is possible to perform the drying processing in the substrate processing system 1 at a low cost.

The substrate processing apparatus according to the exemplary embodiment is a substrate processing apparatus that performs a drying processing of drying a substrate (wafer W) having an upper surface Wa wet with the liquid (IPA liquid 71) by bringing the substrate (wafer W) into contact with the processing fluid 70 in the supercritical state. The substrate processing apparatus includes: a main body 31 having therein a processing space 31a capable of accommodating the substrate (wafer W); a holding unit 32 configured to hold the substrate (wafer W) in the main body 31; a supply unit (fluid supply header 38) provided at a side of the substrate (wafer W) held by the holding unit 32 and configured to supply the processing fluid 70 into the processing space 31a; and a discharge unit (a fluid discharge header 40) configured to discharge the processing fluid 70 from the inside of the processing space 31a. Further, the processing fluid 70 ejected from the supply unit (fluid supply header 38) is directed toward the side above the substrate (wafer W) held by the holding unit 32 while the processing fluid 70 flows from the supply unit (fluid supply header 38) to the discharge unit (fluid discharge header 40). Therefore, it is possible to inhibit a pattern P formed on the upper surface Wa of the wafer W from collapsing during the drying processing using the processing fluid 70.

In the substrate processing apparatus according to the exemplary embodiment, the processing fluid 70 ejected from the supply unit (fluid supply header 38) is inclined upward. Therefore, it is possible to realize the compact drying processing unit 17.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus that performs a drying processing of drying a substrate, the substrate processing apparatus comprising:
   a main body having therein a processing space capable of accommodating the substrate having an upper surface wet with a liquid, wherein the substrate is dried by bringing the substrate into contact with a processing fluid in a supercritical state;
   a holder configured to hold the substrate within the main body;
   a supply provided at a side of the substrate held by the holder and configured to supply the processing fluid into the processing space;
   an exhaust configured to discharge the processing fluid from an inside of the processing space; and
   a flow path limiter configured to limit an upstream side lower end of a flow path which is formed while the processing fluid flows from the supply to the exhaust,
   wherein the flow path limiter has an upper end which is disposed at a position higher than the upper surface of the substrate held by the holder.

2. The substrate processing apparatus of claim 1, wherein the upper end of the flow path limiter is disposed at a position lower than an upper end of the liquid applied onto the substrate.

3. The substrate processing apparatus of claim 1, wherein the flow path limiter is a rectifying plate disposed between the supply and the substrate held by the holder, the rectifying plate having an upper end disposed at a position higher than the upper surface of the substrate.

4. The substrate processing apparatus of claim 3, wherein the rectifying plate is provided on the holder.

5. The substrate processing apparatus of claim 3, further comprising a separate rectifying plate provided at a downstream side of the flow path.

6. The substrate processing apparatus of claim 1, wherein the flow path limiter is a lower portion of a supply port in the supply.

7. A substrate processing apparatus that performs a drying processing of drying a substrate, the substrate processing apparatus comprising:
   a main body having therein a processing space capable of accommodating the substrate having an upper surface wet with a liquid, wherein the substrate is dried by bringing the substrate into contact with a processing fluid in a supercritical state;
   a holder configured to hold the substrate within the main body;
   a supply having a supply port provided at a side of the substrate held by the holder and configured to supply the processing fluid into the processing space; and
   an exhaust configured to discharge the processing fluid from an inside of the processing space,
   wherein a lower portion of the supply port is a flow path limiter configured to limit an upstream side lower end of a flow path which is formed while the processing fluid flows from the supply to the exhaust, and
   wherein the processing fluid ejected from the supply is directed toward a side above the substrate held by the holder while the processing fluid flows from the supply to the exhaust.

8. The substrate processing apparatus of claim 7, wherein a direction of the processing fluid ejected from the supply port is inclined upward.

* * * * *